(12) United States Patent
Royer (10) Patent No.: US 11,605,416 B1
(45) Date of Patent: Mar. 14, 2023

(54) REDUCING DUTY CYCLE DEGRADATION FOR A SIGNAL PATH

(71) Applicant: Micron Technology, Inc., Boise, ID (US)

(72) Inventor: Roman A. Royer, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 17/523,467

(22) Filed: Nov. 10, 2021

(51) Int. Cl.
G11C 11/40 (2006.01)
G11C 11/4076 (2006.01)
G11C 11/22 (2006.01)

(52) U.S. Cl.
CPC ...... G11C 11/4076 (2013.01); G11C 11/2293 (2013.01); G11C 11/221 (2013.01)

(58) Field of Classification Search
CPC ............ G11C 11/4076; G11C 11/2293; G11C 11/221
See application file for complete search history.

(56) References Cited

U.S. PATENT DOCUMENTS

| 8,519,767 | B2 | 8/2013 | Booth et al. |
| 8,692,603 | B2 | 4/2014 | Booth et al. |
| 8,842,486 | B2* | 9/2014 | Do .................. G11C 29/1201 365/201 |
| 8,947,971 | B2 | 2/2015 | Kodama |
| 2014/0232452 | A1* | 8/2014 | Matsumoto ............ H02M 3/07 327/536 |

* cited by examiner

Primary Examiner — Han Yang
(74) Attorney, Agent, or Firm — Holland & Hart, LLP (57) ABSTRACT

Methods, systems, and devices for reducing duty cycle degradation for a signal path are described. In some examples, a memory system may alternate a polarity of a signal line or signal path that includes a set of transistors during successive active periods of the memory system. In some cases, the memory device may include an inversion control component configured to operate the signal using either a first polarity or a second polarity. The inversion control component may receive an indication when the memory system enters an active period, and may accordingly alternate or the polarity of the signal path during successive active periods. In some examples, the signal path may be coupled with one or more output components which may uninvert signals from the signal path when the inversion control component has inverted the polarity of the signal path.

20 Claims, 6 Drawing Sheets

REDUCING DUTY CYCLE DEGRADATION FOR A SIGNAL PATH

FIELD OF TECHNOLOGY

The following relates generally to one or more systems for memory and more specifically to reducing duty cycle degradation for a signal path.

BACKGROUND

Memory devices are widely used to store information in various electronic devices such as computers, user devices, wireless communication devices, cameras, digital displays, and the like. Information is stored by programing memory cells within a memory device to various states. For example, binary memory cells may be programmed to one of two supported states, often denoted by a logic 1 or a logic 0. In some examples, a single memory cell may support more than two states, any one of which may be stored. To access the stored information, a component may read, or sense, at least one stored state in the memory device. To store information, a component may write, or program, the state in the memory device.

Various types of memory devices and memory cells exist, including magnetic hard disks, random access memory (RAM), read-only memory (ROM), dynamic RAM (DRAM), synchronous dynamic RAM (SDRAM), static RAM (SRAM), ferroelectric RAM (FeRAM), magnetic RAM (MRAM), resistive RAM (RRAM), flash memory, phase change memory (PCM), self-selecting memory, chalcogenide memory technologies, and others. Memory cells may be volatile or non-volatile. Non-volatile memory, e.g., FeRAM, may maintain their stored logic state for extended periods of time even in the absence of an external power source. Volatile memory devices, e.g., DRAM, may lose their stored state when disconnected from an external power source.

DETAILED DESCRIPTION

In some devices, such as memory devices or memory systems, transistors included in the circuitry of the device may degrade over time. For example, a transistor that is continually "on" or activated may experience a negative temperature bias instability (NBTI) or more generally a temperature bias instability (BTI) degradation, in which the threshold voltage of the transistor may change over the lifetime of the transistor. A system using transistors that have degraded may experience a decrease in operational efficiency, for example due to slower signal transmission through the degraded transistors. In some examples, if a first set of transistors of a system degrade to a higher degree than a separate second set of transistors, the system may experience a duty cycle distortion. That is, the timing of signals transmitted using the first set of transistors may become distorted compared to the timing of signals transmitted using the second set of transistors due to an uneven degradation between the two sets.

Some memory systems may mitigate duty cycle distortion by transmitting an oscillating signal during idle times (e.g., inactive periods) of the system. For example, when a system is not otherwise active, such as if a memory device is not performing commands or sending signals associated with commands (e.g., an idle period), an oscillating signal may be applied to the transistors of the system. The oscillating signal may periodically transition the transistors of the system between an activated and inactivated state, thus "evening out" or balancing the amount of time each transistor spends in an activated state or an inactivated state and consequently mitigating duty cycle distortion. However, in some systems, the active periods may include unequal durations in activated and inactivated states, so that a set of transistors may degrade more rapidly than another set of transistors, which may lead to duty cycle distortion.

As described herein, a memory system may mitigate (e.g., reduce) duty cycle distortion of a set of transistors, for example included in a chain of inverters, by alternating a polarity of a signal line or signal path that includes the set of transistors during successive active periods of the memory system. For example, the memory device may include an inversion control component, such as a flip-flop circuit, configured to operate the signal using either a first polarity or a second polarity. The inversion control component may receive an indication when the memory system enters an active period, and may accordingly alternate the polarity of the signal path during successive active periods (e.g., invert the polarity of the signal path from the first polarity to the second polarity during a first active period, and uninvert the polarity from the second polarity to the first polarity during a successive second active period). In some examples, the signal path may be coupled with one or more output components which may uninvert signals from the signal path when the inversion control component has inverted the polarity of the signal path. Accordingly, transistors configured to be activated using the signal path, such as a chain of inverters on the signal path, may be more evenly degraded, thus mitigating duty cycle distortion.

Features of the disclosure are initially described in the context of systems and dies as described with reference to FIGS. 1 and 2. Features of the disclosure are described in the context of a timing diagram and a circuit as described with reference to FIGS. 3-4. These and other features of the disclosure are further illustrated by and described with reference to an apparatus diagram and flowcharts that relate to reducing duty cycle degradation for a signal path as described with reference to FIGS. 5-6.

Figure 1:
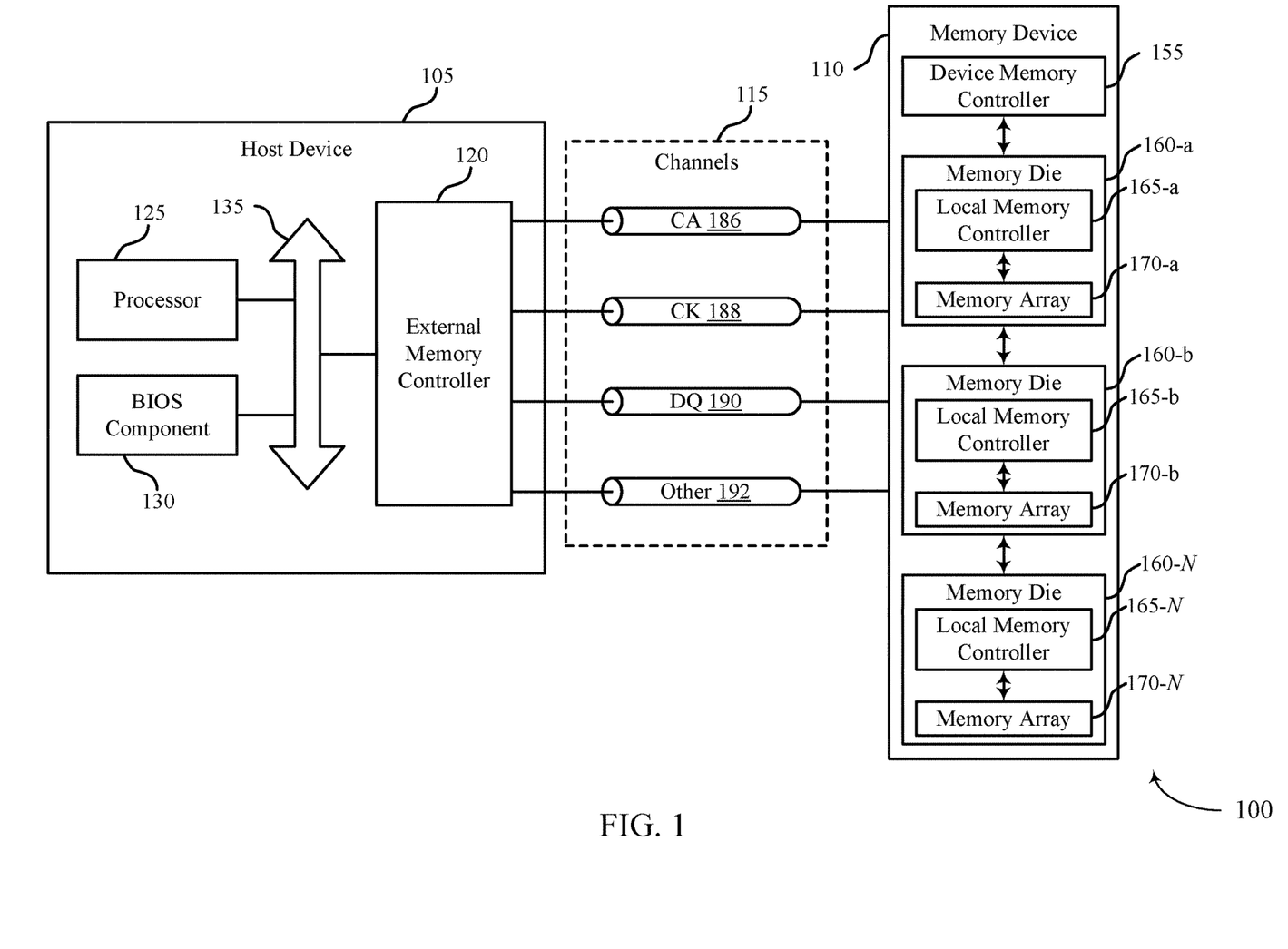
FIG. 1 illustrates an example of a system that supports reducing duty cycle degradation for a signal path in accordance with examples as disclosed herein.

FIG. 1 illustrates an example of a system 100 that supports reducing duty cycle degradation for a signal path in accordance with examples as disclosed herein. The system 100 may include a host device 105, a memory device 110, and a plurality of channels 115 coupling the host device 105 with the memory device 110. The system 100 may include one or more memory devices 110, but aspects of the one or more memory devices 110 may be described in the context of a single memory device (e.g., memory device 110).

The system 100 may include portions of an electronic device, such as a computing device, a mobile computing device, a wireless device, a graphics processing device, a vehicle, or other systems. For example, the system 100 may illustrate aspects of a computer, a laptop computer, a tablet computer, a smartphone, a cellular phone, a wearable device, an internet-connected device, a vehicle controller, or the like. The memory device 110 may be a component of the system operable to store data for one or more other components of the system 100.

At least portions of the system 100 may be examples of the host device 105. The host device 105 may be an example of a processor or other circuitry within a device that uses memory to execute processes, such as within a computing device, a mobile computing device, a wireless device, a graphics processing device, a computer, a laptop computer, a tablet computer, a smartphone, a cellular phone, a wearable device, an internet-connected device, a vehicle controller, a system on a chip (SoC), or some other stationary or portable electronic device, among other examples. In some examples, the host device 105 may refer to the hardware, firmware, software, or a combination thereof that implements the functions of an external memory controller 120. In some examples, the external memory controller 120 may be referred to as a host or a host device 105.

A memory device 110 may be an independent device or a component that is operable to provide physical memory addresses/space that may be used or referenced by the system 100. In some examples, a memory device 110 may be configurable to work with one or more different types of host devices. Signaling between the host device 105 and the memory device 110 may be operable to support one or more of: modulation schemes to modulate the signals, various pin configurations for communicating the signals, various form factors for physical packaging of the host device 105 and the memory device 110, clock signaling and synchronization between the host device 105 and the memory device 110, timing conventions, or other factors.

The memory device 110 may be operable to store data for the components of the host device 105. In some examples, the memory device 110 may act as a secondary-type or dependent-type device to the host device 105 (e.g., responding to and executing commands provided by the host device 105 through the external memory controller 120). Such commands may include one or more of a write command for a write operation, a read command for a read operation, a refresh command for a refresh operation, or other commands.

The host device 105 may include one or more of an external memory controller 120, a processor 125, a basic input/output system (BIOS) component 130, or other components such as one or more peripheral components or one or more input/output controllers. The components of the host device 105 may be coupled with one another using a bus 135.

The processor 125 may be operable to provide control or other functionality for at least portions of the system 100 or at least portions of the host device 105. The processor 125 may be a general-purpose processor, a digital signal processor (DSP), an application-specific integrated circuit (ASIC), a field-programmable gate array (FPGA) or other programmable logic device, discrete gate or transistor logic, discrete hardware components, or a combination of these components. In such examples, the processor 125 may be an example of a central processing unit (CPU), a graphics processing unit (GPU), a general purpose GPU (GPGPU), or an SoC, among other examples. In some examples, the external memory controller 120 may be implemented by or be a part of the processor 125.

The BIOS component 130 may be a software component that includes a BIOS operated as firmware, which may initialize and run various hardware components of the system 100 or the host device 105. The BIOS component 130 may also manage data flow between the processor 125 and the various components of the system 100 or the host device 105. The BIOS component 130 may include a program or software stored in one or more of read-only memory (ROM), flash memory, or other non-volatile memory.

In some examples, the system 100 or the host device 105 may include an input component, an output component, or both. An input component may represent a device or signal external to the system 100 that provides information, signals, or data to the system 100 or its components. In some examples, and input component may include a user interface or interface with or between other devices. In some examples, an input component may be a peripheral that interfaces with system 100 via one or more peripheral components or may be managed by an I/O controller. An output component may represent a device or signal external to the system 100 operable to receive an output from the system 100 or any of its components. Examples of an output component may include a display, audio speakers, a printing device, another processor on a printed circuit board, and others. In some examples, an output may be a peripheral that interfaces with the system 100 via one or more peripheral components or may be managed by an I/O controller.

The memory device 110 may include a device memory controller 155 and one or more memory dies 160 (e.g., memory chips) to support a desired capacity or a specified capacity for data storage. Each memory die 160 (e.g., memory die 160-a, memory die 160-b, memory die 160-N) may include a local memory controller 165 (e.g., local memory controller 165-a, local memory controller 165-b, local memory controller 165-N) and a memory array 170 (e.g., memory array 170-a, memory array 170-b, memory array 170-N). A memory array 170 may be a collection (e.g., one or more grids, one or more banks, one or more tiles, one or more sections) of memory cells, with each memory cell being operable to store at least one bit of data. A memory device 110 including two or more memory dies 160 may be referred to as a multi-die memory or a multi-die package or a multi-chip memory or a multi-chip package.

The device memory controller 155 may include circuits, logic, or components operable to control operation of the memory device 110. The device memory controller 155 may include the hardware, the firmware, or the instructions that enable the memory device 110 to perform various operations and may be operable to receive, transmit, or execute commands, data, or control information related to the components of the memory device 110. The device memory controller 155 may be operable to communicate with one or more of the external memory controller 120, the one or more memory dies 160, or the processor 125. In some examples, the device memory controller 155 may control operation of the memory device 110 described herein in conjunction with the local memory controller 165 of the memory die 160.

In some examples, the memory device 110 may receive data or commands or both from the host device 105. For example, the memory device 110 may receive a write command indicating that the memory device 110 is to store data for the host device 105 or a read command indicating that the memory device 110 is to provide data stored in a memory die 160 to the host device 105.

A local memory controller 165 (e.g., local to a memory die 160) may include circuits, logic, or components operable to control operation of the memory die 160. In some examples, a local memory controller 165 may be operable to communicate (e.g., receive or transmit data or commands or both) with the device memory controller 155. In some examples, a memory device 110 may not include a device memory controller 155, and a local memory controller 165 or the external memory controller 120 may perform various functions described herein. As such, a local memory controller 165 may be operable to communicate with the device memory controller 155, with other local memory controllers 165, or directly with the external memory controller 120, or the processor 125, or a combination thereof. Examples of components that may be included in the device memory controller 155 or the local memory controllers 165 or both may include receivers for receiving signals (e.g., from the external memory controller 120), transmitters for transmitting signals (e.g., to the external memory controller 120), decoders for decoding or demodulating received signals, encoders for encoding or modulating signals to be transmitted, or various other circuits or controllers operable for supporting described operations of the device memory controller 155 or local memory controller 165 or both.

The external memory controller 120 may be operable to enable communication of one or more of information, data, or commands between components of the system 100 or the host device 105 (e.g., the processor 125) and the memory device 110. The external memory controller 120 may convert or translate communications exchanged between the components of the host device 105 and the memory device 110. In some examples, the external memory controller 120 or other component of the system 100 or the host device 105, or its functions described herein, may be implemented by the processor 125. For example, the external memory controller 120 may be hardware, firmware, or software, or some combination thereof implemented by the processor 125 or other component of the system 100 or the host device 105. Although the external memory controller 120 is depicted as being external to the memory device 110, in some examples, the external memory controller 120, or its functions described herein, may be implemented by one or more components of a memory device 110 (e.g., a device memory controller 155, a local memory controller 165) or vice versa.

The components of the host device 105 may exchange information with the memory device 110 using one or more channels 115. The channels 115 may be operable to support communications between the external memory controller 120 and the memory device 110. Each channel 115 may be examples of transmission mediums that carry information between the host device 105 and the memory device. Each channel 115 may include one or more signal paths or transmission mediums (e.g., conductors) between terminals associated with the components of the system 100. A signal path may be an example of a conductive path operable to carry a signal. For example, a channel 115 may include a first terminal including one or more pins or pads at the host device 105 and one or more pins or pads at the memory device 110. A pin may be an example of a conductive input or output point of a device of the system 100, and a pin may be operable to act as part of a channel.

Channels 115 (and associated signal paths and terminals) may be dedicated to communicating one or more types of information. For example, the channels 115 may include one or more command and address (CA) channels 186, one or more clock signal (CK) channels 188, one or more data (DQ) channels 190, one or more other channels 192, or a combination thereof. In some examples, signaling may be communicated over the channels 115 using single data rate (SDR) signaling or double data rate (DDR) signaling. In SDR signaling, one modulation symbol (e.g., signal level) of a signal may be registered for each clock cycle (e.g., on a rising or falling edge of a clock signal). In DDR signaling, two modulation symbols (e.g., signal levels) of a signal may be registered for each clock cycle (e.g., on both a rising edge and a falling edge of a clock signal).

In some examples, CA channels 186 may be operable to communicate commands between the host device 105 and the memory device 110 including control information associated with the commands (e.g., address information). For example, commands carried by the CA channel 186 may include a read command with an address of the desired data. In some examples, a CA channel 186 may include any quantity of signal paths to decode one or more of address or command data (e.g., eight or nine signal paths).

In some examples, clock signal channels 188 may be operable to communicate one or more clock signals between the host device 105 and the memory device 110. Each clock signal may be operable to oscillate between a high state and a low state, and may support coordination (e.g., in time) between actions of the host device 105 and the memory device 110. In some examples, the clock signal may be single ended. In some examples, the clock signal may provide a timing reference for command and addressing operations for the memory device 110, or other system-wide operations for the memory device 110. A clock signal therefore may be referred to as a control clock signal, a command clock signal, or a system clock signal. A system clock signal may be generated by a system clock, which may include one or more hardware components (e.g., oscillators, crystals, logic gates, transistors).

In some examples, the memory device 110 may include a set of transistors, such as a chain of inverters, as part of timing or clock circuitry. The memory device 110 may alternate or invert a polarity of a signal path coupled with the set of transistors during successive active periods of the memory device 110. For example, the memory system 110 may operate the signal path using a first polarity while performing a first access operation (e.g., during a first active period) and may operate the signal path using a second polarity different than the first polarity while performing a second access period (e.g., during a second active period after the first active period).

Figure 2:
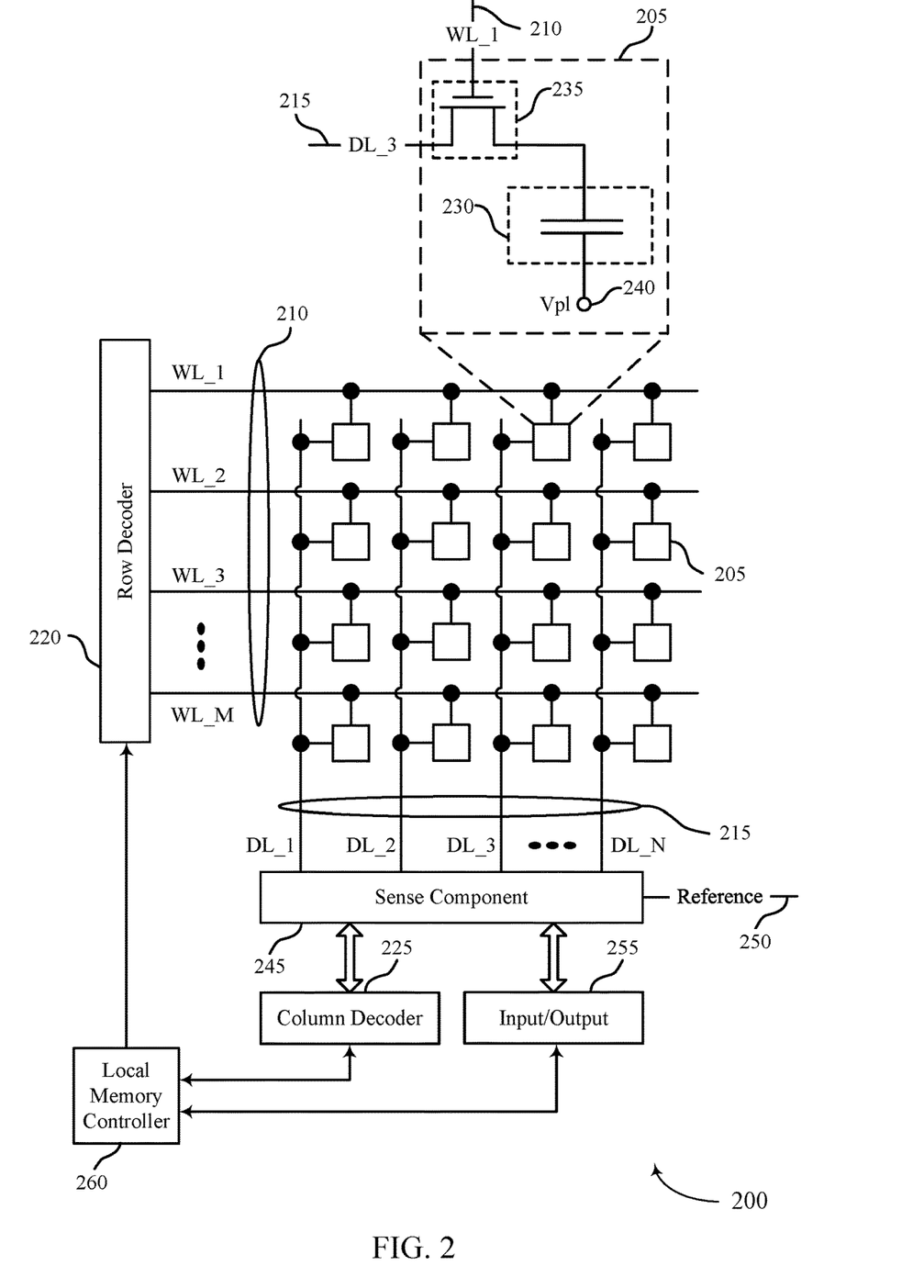
FIG. 2 illustrates an example of a memory die that supports reducing duty cycle degradation for a signal path in accordance with examples as disclosed herein.

FIG. 2 illustrates an example of a memory die 200 that supports reducing duty cycle degradation for a signal path in accordance with examples as disclosed herein. The memory die 200 may be an example of the memory dies 160 described with reference to FIG. 1. In some examples, the memory die 200 may be referred to as a memory chip, a memory device, or an electronic memory apparatus. The memory die 200 may include one or more memory cells 205 that may each be programmable to store different logic states (e.g., programmed to one of a set of two or more possible states). For example, a memory cell 205 may be operable to store one bit of information at a time (e.g., a logic 0 or a logic 1). In some examples, a memory cell 205 (e.g., a multi-level memory cell) may be operable to store more than one bit of information at a time (e.g., a logic 00, logic 01, logic 10, a logic 11). In some examples, the memory cells 205 may be arranged in an array, such as a memory array 170 described with reference to FIG. 1.

A memory cell 205 may store a charge representative of the programmable states in a capacitor. DRAM architectures may include a capacitor that includes a dielectric material to store a charge representative of the programmable state. In other memory architectures, other storage devices and components are possible. For example, nonlinear dielectric materials may be employed. The memory cell 205 may include a logic storage component, such as capacitor 230, and a switching component 235. The capacitor 230 may be an example of a dielectric capacitor or a ferroelectric capacitor. A node of the capacitor 230 may be coupled with a voltage source 240, which may be the cell plate reference voltage, such as Vpl, or may be ground, such as Vss.

The memory die 200 may include one or more access lines (e.g., one or more word lines 210 and one or more digit lines 215) arranged in a pattern, such as a grid-like pattern. An access line may be a conductive line coupled with a memory cell 205 and may be used to perform access operations on the memory cell 205. In some examples, word lines 210 may be referred to as row lines. In some examples, digit lines 215 may be referred to as column lines or bit lines. References to access lines, row lines, column lines, word lines, digit lines, or bit lines, or their analogues, are interchangeable without loss of understanding or operation. Memory cells 205 may be positioned at intersections of the word lines 210 and the digit lines 215.

Operations such as reading and writing may be performed on the memory cells 205 by activating or selecting access lines such as one or more of a word line 210 or a digit line 215. By biasing a word line 210 and a digit line 215 (e.g., applying a voltage to the word line 210 or the digit line 215), a single memory cell 205 may be accessed at their intersection. The intersection of a word line 210 and a digit line 215 in either a two-dimensional or three-dimensional configuration may be referred to as an address of a memory cell 205.

Accessing the memory cells 205 may be controlled through a row decoder 220 or a column decoder 225. For example, a row decoder 220 may receive a row address from the local memory controller 260 and activate a word line 210 based on the received row address. A column decoder 225 may receive a column address from the local memory controller 260 and may activate a digit line 215 based on the received column address.

Selecting or deselecting the memory cell 205 may be accomplished by activating or deactivating the switching component 235 using a word line 210. The capacitor 230 may be coupled with the digit line 215 using the switching component 235. For example, the capacitor 230 may be isolated from digit line 215 when the switching component 235 is deactivated, and the capacitor 230 may be coupled with digit line 215 when the switching component 235 is activated.

The sense component 245 may be operable to detect a state (e.g., a charge) stored on the capacitor 230 of the memory cell 205 and determine a logic state of the memory cell 205 based on the stored state. The sense component 245 may include one or more sense amplifiers to amplify or otherwise convert a signal resulting from accessing the memory cell 205. The sense component 245 may compare a signal detected from the memory cell 205 to a reference 250 (e.g., a reference voltage). The detected logic state of the memory cell 205 may be provided as an output of the sense component 245 (e.g., to an input/output 255), and may indicate the detected logic state to another component of a memory device that includes the memory die 200.

The local memory controller 260 may control the accessing of memory cells 205 through the various components (e.g., row decoder 220, column decoder 225, sense component 245). The local memory controller 260 may be an example of the local memory controller 165 described with reference to FIG. 1. In some examples, one or more of the row decoder 220, column decoder 225, and sense component 245 may be co-located with the local memory controller 260. The local memory controller 260 may be operable to receive one or more of commands or data from one or more different memory controllers (e.g., an external memory controller 120 associated with a host device 105, another controller associated with the memory die 200), translate the commands or the data (or both) into information that can be used by the memory die 200, perform one or more operations on the memory die 200, and communicate data from the memory die 200 to a host device 105 based on performing the one or more operations. The local memory controller 260 may generate row signals and column address signals to activate the target word line 210 and the target digit line 215. The local memory controller 260 may also generate and control various voltages or currents used during the operation of the memory die 200. In general, the amplitude, the shape, or the duration of an applied voltage or current discussed herein may be varied and may be different for the various operations discussed in operating the memory die 200.

The local memory controller 260 may be operable to perform one or more access operations on one or more memory cells 205 of the memory die 200. Examples of access operations may include a write operation, a read operation, a refresh operation, a precharge operation, or an activate operation, among others. In some examples, access operations may be performed by or otherwise coordinated by the local memory controller 260 in response to various access commands (e.g., from a host device 105). The local memory controller 260 may be operable to perform other access operations not listed here or other operations related to the operating of the memory die 200 that are not directly related to accessing the memory cells 205.

The local memory controller 260 may be operable to perform a write operation (e.g., a programming operation) on one or more memory cells 205 of the memory die 200. During a write operation, a memory cell 205 of the memory die 200 may be programmed to store a desired logic state. The local memory controller 260 may identify a target memory cell 205 on which to perform the write operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The local memory controller 260 may apply a specific signal (e.g., write pulse) to the digit line 215 during the write operation to store a specific state (e.g., charge) in the capacitor 230 of the memory cell 205. The pulse used as part of the write operation may include one or more voltage levels over a duration.

The local memory controller 260 may be operable to perform a read operation (e.g., a sense operation) on one or more memory cells 205 of the memory die 200. During a read operation, the logic state stored in a memory cell 205 of the memory die 200 may be determined. The local memory controller 260 may identify a target memory cell 205 on which to perform the read operation. The local memory controller 260 may identify a target word line 210 and a target digit line 215 coupled with the target memory cell 205 (e.g., the address of the target memory cell 205). The local memory controller 260 may activate the target word line 210 and the target digit line 215 (e.g., applying a voltage to the word line 210 or digit line 215) to access the target memory cell 205. The target memory cell 205 may transfer a signal to the sense component 245 in response to biasing the access lines. The sense component 245 may amplify the signal. The local memory controller 260 may activate the sense component 245 (e.g., latch the sense component) and thereby compare the signal received from the memory cell 205 to the reference 250. Based on that comparison, the sense component 245 may determine a logic state that is stored on the memory cell 205.

In some cases, one or more components of memory die 200 may include a set of transistors which may degrade over time. Components using transistors that have degraded may experience a decrease in operational efficiency, for example due to slower signal transmission through the degraded transistors. In some examples, if a first set of transistors of a system degrade to a higher degree than a separate second set of transistors, the system may experience a duty cycle distortion. In some cases, a memory die 200 may mitigate duty cycle distortion by transmitting an oscillating signal through the set of transistors during idle times (e.g., inactive periods) of the memory die 200. The oscillating signal may periodically transition the set of transistors of the memory die 200 between an activated and inactivated state, thus "evening out" or balancing the amount of time each transistor spends in an activated state or an inactivated state and consequently mitigating duty cycle distortion. However, in some systems, the active periods may include unequal durations in activated and inactivated states, so that a set of transistors may degrade more rapidly than another set of transistors, which may lead to duty cycle distortion.

As described herein, a memory die 200 may mitigate (e.g., reduce) duty cycle distortion of a set of transistors by alternating a polarity of a signal line or signal path that includes the set of transistors during successive active periods of the memory system. For example, the memory die 200 may include an inversion control component, such as a flip-flop circuit, configured to operate the signal using either a first polarity or a second polarity. The inversion control component may receive an indication when the memory die 200 enters an active period, for example when performing an access operation, and may accordingly alternate or the polarity of the signal path during successive active periods (e.g., invert the polarity of the signal path from the first polarity to the second polarity during a first active period, and uninvert the polarity from the second polarity to the first polarity during a successive second active period). In some examples, the signal path may be coupled with one or more output components which may uninvert signals from the signal path when the inversion control component has inverted the polarity of the signal path. The output components may output signals to components of the memory die 200, such as the row decoder 220, the column decoder 225, the sense components 245, among other examples. Accordingly, transistors configured to be activated using the signal path, such as a chain of inverters on the signal path, may be more evenly degraded, thus mitigating duty cycle distortion.

Figure 3:
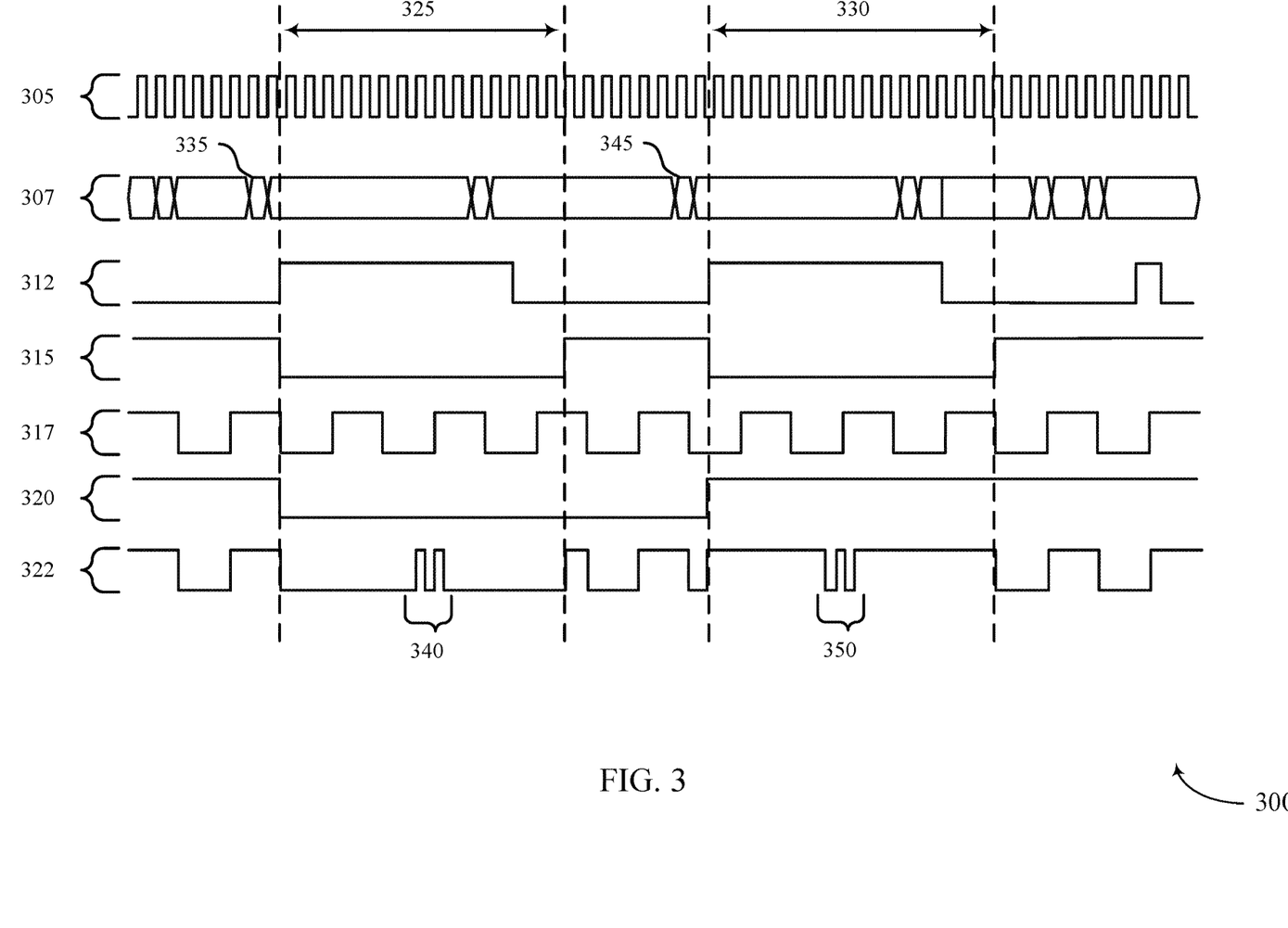
FIG. 3 illustrates an example of a timing diagram that supports reducing duty cycle degradation for a signal path in accordance with examples as disclosed herein.

FIG. 3 illustrates an example of a timing diagram 300 that supports reducing duty cycle degradation for a signal path in accordance with examples as disclosed herein. Timing diagram 300 represents a set of signals being transmitted during a time interval to a memory device, such the memory device 110, as described with reference to FIG. 1. Timing diagram 300 may include a clock signal 305 configured to control signal timing and other aspects of the timing diagram 300. Timing diagram 300 may include a command signal 307, which may be used in transmitting commands for accessing data stored in the memory device, such as read commands, write commands, or erase commands. Timing diagram 300 may include a read state signal 312, which may indicate whether the memory device is in an active state, such as a read state. Timing diagram 300 may include an oscillator enable signal 315 and an oscillating signal 317. The oscillator enable signal 315 may indicate whether the memory device should apply the oscillating signal 317 to components of the memory device, such as a read clock path. Timing diagram 300 may include a clock path invert enable signal 320 and a clock path signal 322. The clock path invert enable signal 320 may indicate whether the memory device should invert the clock path signal 322, for example during active periods associated with commands performed by the memory device.

One or more channels or components of the memory device used to communicate the signals illustrated in timing diagram 300 may include a set or chain of transistors. For example, the clock path signal 322 may be transmitted over a clock path that includes a chain of inverters. If the clock path signal 322 is low, a first set of transistors of the clock path may be activated, while a second set of transistors on the clock path may be inactivated (e.g., a high signal may be applied to the first set of transistors, and a low signal may be applied to the second set of transistors). Alternatively, if the clock path signal 322 is high, the first set of transistors of the clock path may be inactivated, while the second set of transistors on the clock path may be activated. Thus, if the clock path signal 322 remains in either a high or low state (e.g., if the clock path signal 322 remains stable) for a long period of time, the clock path may experience duty cycle distortion due to uneven degradation of the transistors of the clock path.

Commands, such as read or write commands, may be transmitted to the memory device using the command signal 307. In some cases, to execute commands received using the command signal 307, the memory device may enter an active period (e.g., switch from an idle state to an active period), such as the active periods 325 and 330. For example, a first read command 335 may be transmitted to the memory device using the command signal 307 In some cases, in response to receiving the first read command 335 the memory device may receive a signal to enter active period 325. In some examples, the signal to enter the active period 325 may be the read state signal 312 going from a low voltage to a high voltage (e.g., based on the first read command 335).

In some examples, during idle periods of timing diagram 300 (e.g., outside the active periods 325 and 330), the oscillating signal 317 may be transmitted over the clock path. In some cases, the oscillating signal 317 may toggle states of transistors of the clock path, thus mitigating duty cycle distortion. However, during the active periods 325 and 330, the oscillating signal 317 may be deactivated (e.g., not applied to the clock path), so that the clock path may transmit signaling to perform read or write commands. In some examples, the oscillating signal 317 may be activated or deactivated in response to the oscillator enable signal 315.

During the active period 325, the memory device may perform actions and operations to execute the first read command 335. For example, the memory device may transmit or receive read traffic signal 340 over the clock path as part of performing the read command 335. However, during the active period 325, the clock path signal 322 may remain in a same state (e.g., a low state) for a substantial portion of the active period. For example, the active period 325 may include read entry times, read exit times, or both, outside of the time spent transmitting read traffic signal 340. In other words, during the first active period 325, the clock path may remain in a default state (e.g., the low state) except to transmit signals such as the read traffic signal 340. Thus, if the clock path signal 322 remains in the same default state over successive active periods, the transistors of the clock path may experience uneven degradation, which may result in duty cycle distortion.

In some cases, the memory device may invert the clock path signal 322 during successive active periods (e.g., active periods 325 and 330). For example, after performing the first read command 335, the memory device may receive a second read command 345. Similar to the signaling performed in response to the first read command 335, the read state signal 312 may transition from a low voltage to a high voltage to signal to the memory device to enter the second active period 330. In response to the read state signal 312, the clock path signal 322 may be inverted.

In some cases, inverting the clock path may be based on inverting the clock path invert enable signal 320. For example, the clock path may be coupled with a path configured to carry the clock path invert enable signal 320. In some cases, the signal on the clock path may be inverted if the signal on the path carrying the clock path invert enable signal 320 is inverted. Thus, in response to read state signal 312 indicating a read state, the clock path invert enable signal 320 may also go from a low voltage to a high voltage.

During the second active period 330, the clock path signal 322 may be inverted (e.g., relative to the first active period 325). Thus, rather than the default state of the clock path being a low state, as in the active period 325, the default state of the clock path may be a high state. In some cases, signals transmitted over the clock path during the second active period 330, such as the read traffic signal 350 or other data associated with the read command 345, may be inverted as well. In such cases, the clock path may include circuitry configured to invert (e.g., re-invert) signals transmitted from the clock path to other components of the memory system if the signal on the clock path has been inverted (e.g., if the clock path invert enable signal 320 is in a high state).

In some examples, the clock path invert enable signal 320 may be configured to alternate between states (e.g., switch from a low state to a high state or switch from a high state to a low state) in response to a command signal, such as the read state signal 312. For example, in response to a third read command, the clock path invert enable signal 320 may again alternate to a low state (e.g., a state different than the state during the second active period 330), and thus a polarity or default state of the clock path signal 322 may be inverted during a third active period with respect to the second active period 330. Similar to the second active period 330, output signals (e.g., the read traffic signal 350) on the clock path may be inverted if the clock path invert enable signal is in a high state. Thus, the default state of the clock path may alternate between successive active periods.

In some cases, alternating the default state for successive active periods may mitigate duty cycle distortion by balancing the amount of time each transistor spends in an activated or inactivated state, for transistors included in a chain of inverters of the clock path. For example, if the system frequently issues commands (e.g., spends a substantial amount of time in active periods), the oscillating signal 317 may not toggle the transistors for a substantial portion of the duty cycle. Thus, alternating the default state between successive active periods may balance the amount of time each transistor spends in an activated or inactivated state, leading to an even degradation of transistors and therefore mitigating duty cycle distortion.

Although examples described herein describe an active period associated with a read operation, active periods may be associated with other operations, such as write operations, erase operations, or other access operations. For example, the polarity of the clock path signal 322 may alternate between a first active period associated with a read operations and a second active period associated with a write operation.

Figure 4:
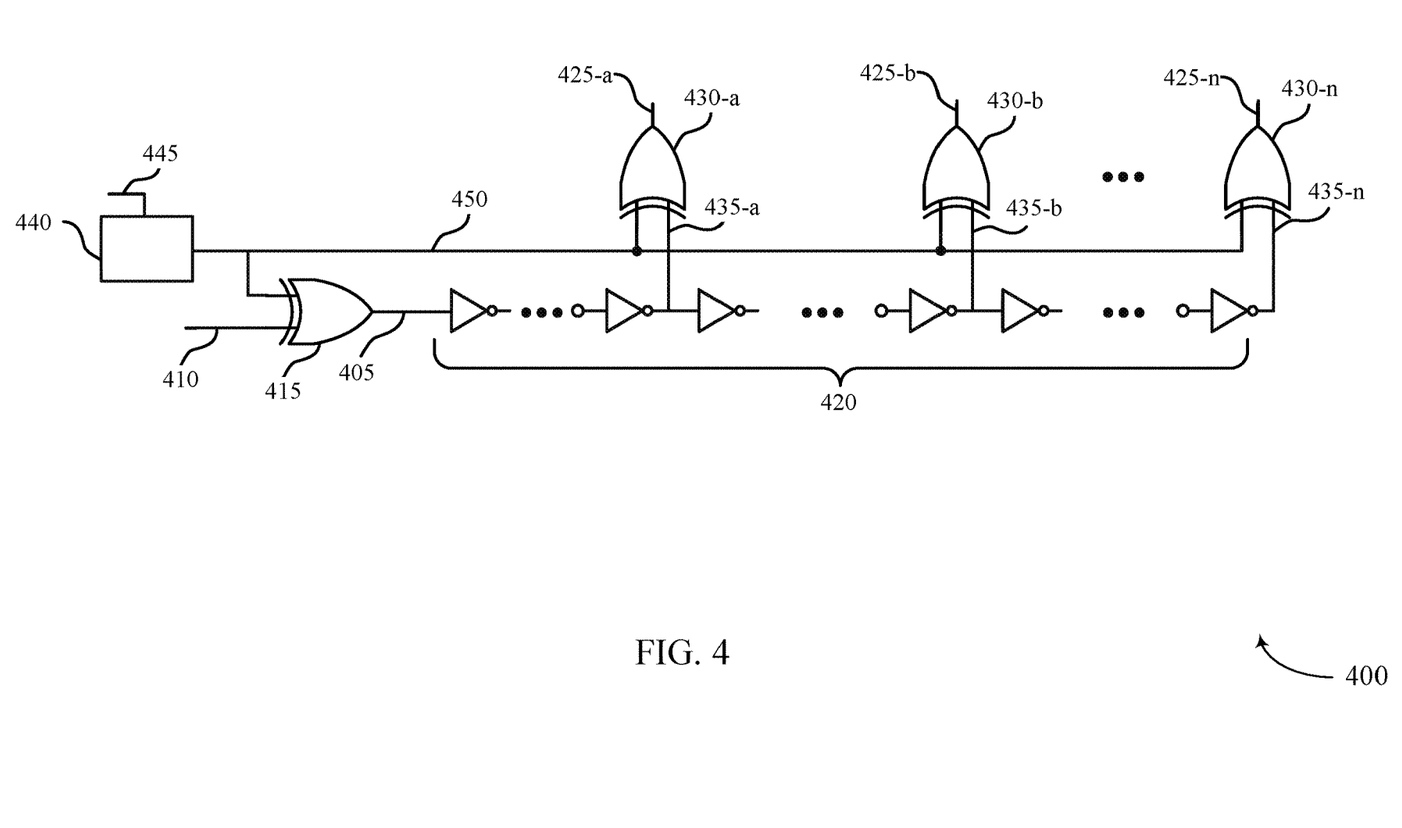
FIG. 4 illustrates an example of a circuit that supports reducing duty cycle degradation for a signal path in accordance with examples as disclosed herein.

FIG. 4 illustrates an example of a circuit 400 that supports reducing duty cycle degradation for a signal path in accordance with examples as disclosed herein. The circuit 400 may be included as part of a memory device, such as the memory device 110 or the memory device 210 as described with reference to FIGS. 1 and 2. The circuit 400 may be used to carry signals, such as the clock path signal 322 as described with reference to FIG. 3, to various components of the memory system, for example as part of performing commands such as read or write commands.

The circuit 400 may include a clock path 405 coupled with a clock input path 410 through an input component 415. The clock path 405 may be an example of a signal path. The clock input path 410 may be an example of an input signal line. In some cases, the clock path 405 may carry signals or other information through a chain 420, for example by receiving input from the clock input path 410, transmitting the signal through one or more inverters of the chain 420, and outputting the signal through one or more output clock paths 425 (e.g., through output clock paths 425-*a* through 425-*n*). Each of the output clock paths 425 may be an example of an output signal line. In some examples, the output clock paths 425 may lead to or otherwise be coupled with components of the memory device.

The chain 420 may include one or more transistors. During operation of the memory device, a first subset of the transistors of the chain 420 may be active, while a separate second subset of transistors may be inactive. In some cases, if the first subset of transistors is active more often (e.g., actively substantially longer) than the second subset, then the first subset may degrade more quickly or experience a more significant degradations than the second subset, which may lead to a duty cycle distortion of the chain 420.

As described with reference to FIG. 3, an oscillating signal may be applied to the clock path 405 during idle periods of the memory device. The oscillating signal may periodically toggle the state of the clock path 405 (e.g., periodically alternate between a high state and a low state), so that each transistor of the chain 420 may be active for a roughly equal amount of time. Periodically toggling the transistors of the chain 420 may therefore mitigate duty cycle distortion by balancing or "evening out" the degradation of the transistors.

However, the oscillating signal may be deactivated during active periods of the memory device, so that the memory device may use the clock path 405 to transmit signals, such as read traffic signal 340 or read traffic signal 350 as described with reference to FIG. 3, as part of performing commands. In some cases, the memory device may spend a significant portion of time in an active state, which may result in the transistors of the chain 420 spending a significant portion of time in a default state of the active periods, thus increasing duty cycle degradation.

In some cases, the circuit 400 may invert the polarity of the clock path 405 during alternating active periods of the memory system. For example, the clock path 405 may be coupled with an invert path 450 and the clock input path 410 using the input component 415. For example, the invert path 450 and the clock input path 410 may be inputs to the input component 415, while the clock path 405 may be an output of the input component 415. The input component 415 may be an example of an exclusive-or (XOR) gate or other circuit which may provide inversion functions. Thus, if the invert path 450 is high (e.g., a logic "1"), the output of the output component 430-a may be the inverse of the signal on the clock input path 410. Alternatively, if the invert path is low (e.g., a logic "0"), the output of the output component 430-a may be the signal on the clock input path 410.

The invert path 450 may also be coupled with the output clock paths 425-a through 425-n, for example through one or more respective output components 430-a through 430-n. The output components 430-a through 430-n may be examples of XOR gates or other circuits which provide inversion functions. The output clock paths 425-a through 425-n may output signals on the clock path 405 using output clock paths 435-a through 435-n, which may respectively be coupled with inputs of the output components 430-a through 430-n. Thus, in cases in which a polarity on the clock path 405 has been inverted, the output components 430-a through 430-n may again invert (e.g., uninvert) a signal from the clock path 405 to one or more output clock paths 425-a through 425-n.

In some cases, the polarity of the signal on the invert path 450 may be controlled (e.g., determined, indicated) by an inversion control component 440. The inversion control component 440 may set the state of the invert path 450 in response to receiving a control signal from a control line 445. For example, the control line 445 may indicate whether the memory system is in an active state by carrying a control signal to the inversion control component 440. The inversion control component 440 may output a control signal (e.g., using the received control signal) to the input component 415. In some cases, the inversion control component 440 may be an example of a flip-flop circuit.

By way of example, in response to the control line 445 inputting a signal to the inversion control component 440 indicating that the memory system is in an active state, the inversion control component 440 may alternate (e.g., toggle) the polarity on the invert path 450. For example, if the invert path 450 is in a high state (e.g., if the signal on the invert path 450 represents a logic "1") and the inversion control component 440 receives a signal indicating that the memory system has entered an active state, the inversion control component 440 may switch the signal on the invert path 450 from the high state to a low state (e.g., to a logic "0"). Alternatively, if the invert path 450 is in the low state and the inversion control component 440 receives a signal indicating that the memory system has entered an active state, the inversion control component 440 may switch the polarity on the invert path 450 from the low state to the high state. In some cases, control line 445 may carry the read state signal 312, as described with reference to FIG. 3.

Accordingly, the polarity of the clock path 405 may be alternated (e.g., toggled) for successive active periods of the memory device. Alternating the default state between successive active periods may balance the amount of time each transistor spends in an activated or inactivated state, leading to an even degradation of transistors and therefore mitigating duty cycle distortion.

Figure 5:
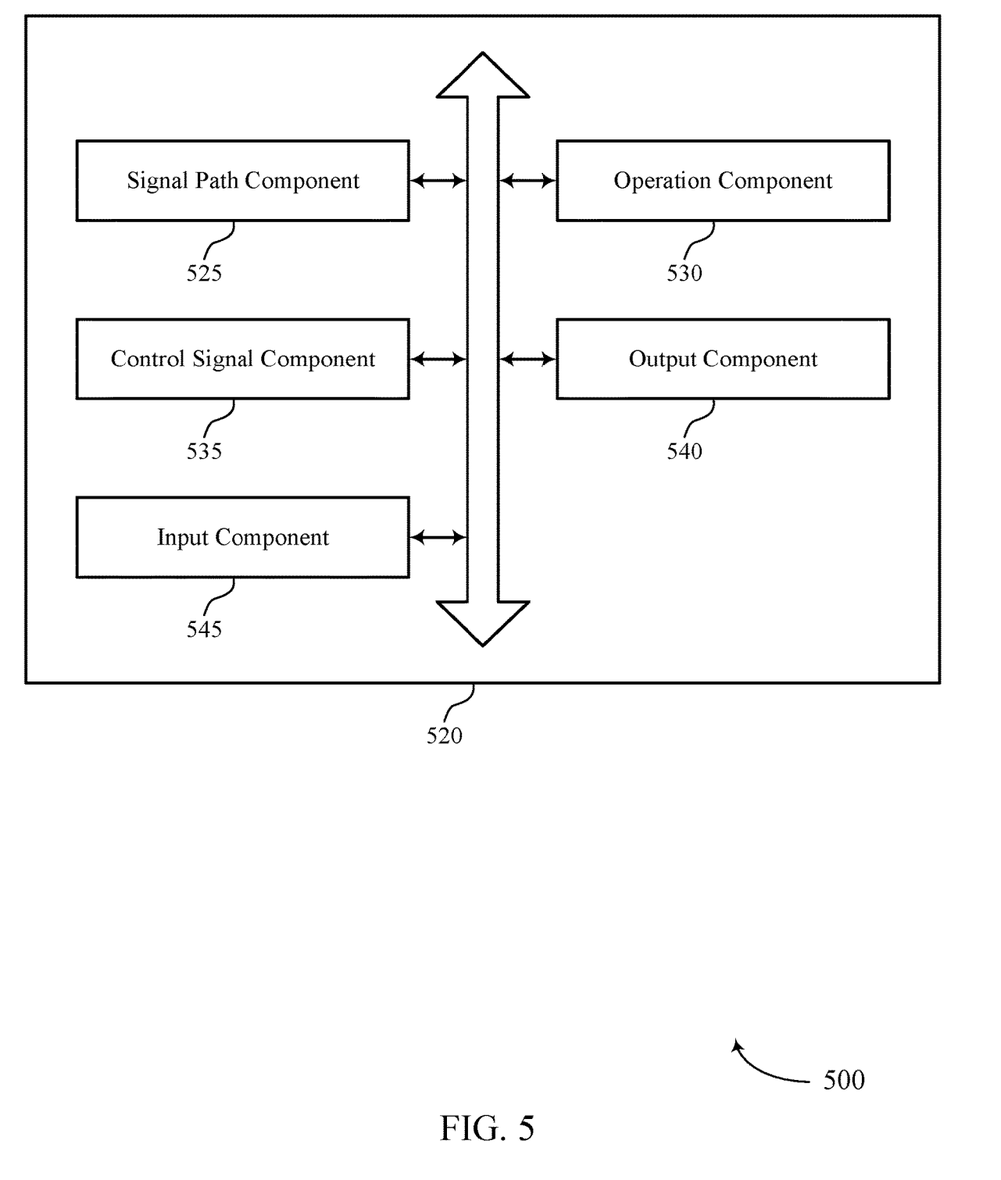
FIG. 5 shows a block diagram of a memory system that supports reducing duty cycle degradation for a signal path in accordance with examples as disclosed herein.

FIG. 5 shows a block diagram 500 of a memory system 520 that supports reducing duty cycle degradation for a signal path in accordance with examples as disclosed herein.

The memory system 520 may be an example of aspects of a memory system as described with reference to FIGS. 1 through 4. The memory system 520, or various components thereof, may be an example of means for performing various aspects of reducing duty cycle degradation for a signal path as described herein. For example, the memory system 520 may include a signal path component 525, an operation component 530, a control signal component 535, an output component 540, an input component 545, or any combination thereof. Each of these components may communicate, directly or indirectly, with one another (e.g., via one or more buses).

The signal path component 525 may be configured as or otherwise support a means for operating a signal path associated with active periods and inactive periods according to a first polarity during a first subset of the active periods, where the signal path is coupled with an input signal line and one or more output signal lines, and where the first polarity corresponds to signaling on the signal path being inverted relative to an input signal on the input signal line and one or more output signals on the one or more output signal lines. In some examples, the signal path component 525 may be configured as or otherwise support a means for operating the signal path according to a second polarity during a second subset of the active periods, where the second polarity corresponds to signaling on the signal path being uninverted relative to the input signal on the input signal line and the one or more output signals on the one or more output signal lines. The operation component 530 may be configured as or otherwise support a means for performing, during each of the active periods, a respective operation based at least in part on the one or more output signals on the one or more output signal lines.

In some examples, the control signal component 535 may be configured as or otherwise support a means for generating a control signal for an input component coupled with the input signal line and for one or more output components each coupled with a respective output signal line of the one or more output signal lines, where operating the signal path according to the first polarity includes. In some examples, the signal path component 525 may be configured as or otherwise support a means for inverting, using the input component and based at least in part on the control signal, the signaling on the signal path relative to the input signal on the input signal line. In some examples, the output component 540 may be configured as or otherwise support a means for inverting, using each of one or more output components and based at least in part on the control signal, a respective output signal on the respective output signal line relative to the signaling on the signal path.

In some examples, the signal path component 525 may be configured as or otherwise support a means for operating the signal path according to the first polarity during a first subset of the inactive periods. In some examples, the signal path component 525 may be configured as or otherwise support a means for operating the signal path according to the second polarity during a second subset of the inactive periods.

In some examples, a polarity of the signal path is toggled between the first polarity and the second polarity at a beginning of each of the active periods or at a beginning of each of the inactive periods.

In some examples, the one or more output signals on the one or more output signal lines are uninverted relative to the input signal on the input signal line regardless of whether the signal path is operated according to the first polarity or the second polarity.

In some examples, a first device includes the signal path, and the input component 545 may be configured as or otherwise support a means for receiving second signaling at the first device from a second device. In some examples, a first device includes the signal path, and the signal path component 525 may be configured as or otherwise support a means for switching from operating the signal path according to the first polarity to operating the signal path according to the second polarity based at least in part on receiving the second signaling.

In some examples, the signal path includes a clock path, the input signal includes an input clock signal, and the respective output signals include respective output clock signals.

Figure 6:
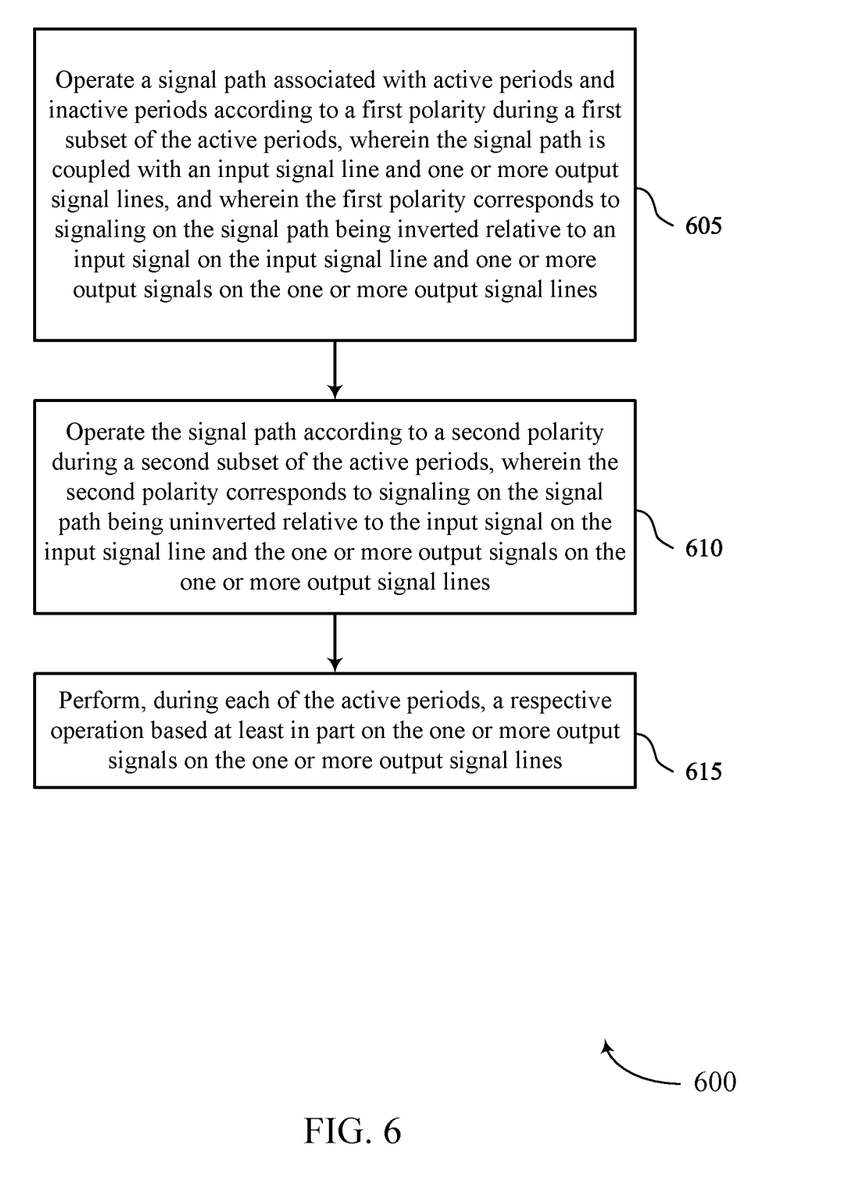
FIG. 6 shows a flowchart illustrating a method or methods that support reducing duty cycle degradation for a signal path in accordance with examples as disclosed herein.

FIG. 6 shows a flowchart illustrating a method 600 that supports reducing duty cycle degradation for a signal path in accordance with examples as disclosed herein. The operations of method 600 may be implemented by a memory system or its components as described herein. For example, the operations of method 600 may be performed by a memory system as described with reference to FIGS. 1 through 5. In some examples, a memory system may execute a set of instructions to control the functional elements of the device to perform the described functions. Additionally or alternatively, the memory system may perform aspects of the described functions using special-purpose hardware.

At 605, the method may include operating a signal path associated with active periods and inactive periods according to a first polarity during a first subset of the active periods, where the signal path is coupled with an input signal line and one or more output signal lines, and where the first polarity corresponds to signaling on the signal path being inverted relative to an input signal on the input signal line and one or more output signals on the one or more output signal lines. The operations of 605 may be performed in accordance with examples as disclosed herein. In some examples, aspects of the operations of 605 may be performed by a signal path component 525 as described with reference to FIG. 5.

At 610, the method may include operating the signal path according to a second polarity during a second subset of the active periods, where the second polarity corresponds to signaling on the signal path being uninverted relative to the input signal on the input signal line and the one or more output signals on the one or more output signal lines. The operations of 610 may be performed in accordance with examples as disclosed herein. In some examples, aspects of the operations of 610 may be performed by a signal path component 525 as described with reference to FIG. 5.

At 615, the method may include performing, during each of the active periods, a respective operation based at least in part on the one or more output signals on the one or more output signal lines. The operations of 615 may be performed in accordance with examples as disclosed herein. In some examples, aspects of the operations of 615 may be performed by an operation component 530 as described with reference to FIG. 5.

In some examples, an apparatus as described herein may perform a method or methods, such as the method 600. The apparatus may include, features, circuitry, logic, means, or instructions (e.g., a non-transitory computer-readable medium storing instructions executable by a processor), or any combination thereof for performing the following aspects of the present disclosure:

Aspect 1: The apparatus, including features, circuitry, logic, means, or instructions, or any combination thereof for operating a signal path associated with active periods and inactive periods according to a first polarity during a first subset of the active periods, where the signal path is coupled with an input signal line and one or more output signal lines, and where the first polarity corresponds to signaling on the signal path being inverted relative to an input signal on the input signal line and one or more output signals on the one or more output signal lines; operating the signal path according to a second polarity during a second subset of the active periods, where the second polarity corresponds to signaling on the signal path being uninverted relative to the input signal on the input signal line and the one or more output signals on the one or more output signal lines; and performing, during each of the active periods, a respective operation based at least in part on the one or more output signals on the one or more output signal lines.

Aspect 2: The apparatus of aspect 1, further including operations, features, circuitry, logic, means, or instructions, or any combination thereof for generating a control signal for an input component coupled with the input signal line and for one or more output components each coupled with a respective output signal line of the one or more output signal lines, where operating the signal path according to the first polarity includes; inverting, using the input component and based at least in part on the control signal, the signaling on the signal path relative to the input signal on the input signal line; and inverting, using each of one or more output components and based at least in part on the control signal, a respective output signal on the respective output signal line relative to the signaling on the signal path.

Aspect 3: The apparatus of any of aspects 1 through 2, further including operations, features, circuitry, logic, means, or instructions, or any combination thereof for operating the signal path according to the first polarity during a first subset of the inactive periods and operating the signal path according to the second polarity during a second subset of the inactive periods.

Aspect 4: The apparatus of any of aspects 1 through 3, further including operations, features, circuitry, logic, means, or instructions, or any combination thereof for a polarity of the signal path is toggled between the first polarity and the second polarity at a beginning of each of the active periods or at a beginning of each of the inactive periods.

Aspect 5: The apparatus of any of aspects 1 through 4, further including operations, features, circuitry, logic, means, or instructions, or any combination thereof for the one or more output signals on the one or more output signal lines are uninverted relative to the input signal on the input signal line regardless of whether the signal path is operated according to the first polarity or the second polarity.

Aspect 6: The apparatus of any of aspects 1 through 5 where a first device includes the signal path and the method, apparatuses, and non-transitory computer-readable medium, further includes operations, features, circuitry, logic, means, or instructions, or any combination thereof for receiving second signaling at the first device from a second device and switching from operating the signal path according to the first polarity to operating the signal path according to the second polarity based at least in part on receiving the second signaling.

Aspect 7: The apparatus of any of aspects 1 through 6, further including operations, features, circuitry, logic, means, or instructions, or any combination thereof for the signal path includes a clock path, the input signal includes an input clock signal, and the respective output signals include respective output clock signals.

It should be noted that the methods described herein describe possible implementations, and that the operations and the steps may be rearranged or otherwise modified and that other implementations are possible. Further, portions from two or more of the methods may be combined.

An apparatus is described. The following provides an overview of aspects of the apparatus as described herein:

Aspect 8: An apparatus, including: an input component for a signal path associated with active periods and inactive periods, the input component coupled with the signal path and an input signal line; one or more output components for the signal path, the one or more output components each coupled with the signal path and a respective output signal line of one or more output signal lines, where each of the active periods corresponds to a respective operation being performed by the apparatus based at least in part on one or more output signals on the one or more output signal lines; and an inversion control component configured to operate the signal path according to a first polarity during a first subset of the active periods and operate the signal path according to a second polarity during a second subset of the active periods, where the first polarity corresponds to signaling on the signal path being inverted relative to an input signal on the input signal line and the one or more output signals on the one or more output signal lines, and where the second polarity corresponds to signaling on the signal path being uninverted relative to the input signal on the input signal line and the one or more output signals on the one or more output signal lines.

Aspect 9: The apparatus of aspect 8, where: the input component is coupled with the inversion control component and configured to selectively invert, based at least in part on a control signal output by the inversion control component, the signaling on the signal path relative to the input signal; and each of the one or more output components is coupled with the inversion control component and configured to selectively invert, based at least in part on the control signal, a respective output signal on the respective output signal line relative to the signaling on the signal path.

Aspect 10: The apparatus of any of aspects 8 through 9, where active periods within the first subset of the active periods alternate with active periods within the second subset.

Aspect 11: The apparatus of any of aspects 8 through 10, where the inversion control component is further configured to: operate the signal path according to the first polarity during a first subset of the inactive periods; and operate the signal path according to the second polarity during a second subset of the inactive periods.

Aspect 12: The apparatus of any of aspects 8 through 11, where the inversion control component is configured to toggle a polarity of the signal path between the first polarity and the second polarity at a beginning of each of the active periods or at a beginning of each of the inactive periods.

Aspect 13: The apparatus of any of aspects 8 through 12, where the one or more output signals on the one or more output signal lines are uninverted relative to the input signal on the input signal line regardless of whether the signal path is operated according to the first polarity or the second polarity.

Aspect 14: The apparatus of any of aspects 8 through 13, where the inversion control component is further configured to: switch from operating the signal path according to the first polarity to operating the signal path according to the second polarity based at least in part on second signaling being received by the apparatus.

Aspect 15: The apparatus of aspect 14, where the respective operation corresponding to each of the active periods is performed by the apparatus based at least in part on the second signaling being received by the apparatus.

Aspect 16: The apparatus of any of aspects 14 through 15, where: the apparatus includes a memory device; and the second signaling includes a command to access a memory array within the memory device.

Aspect 17: The apparatus of any of aspects 8 through 16, where the inversion control component includes a flip-flop circuit configured to change state based at least in part on a beginning of an active period for the signal path.

Aspect 18: The apparatus of any of aspects 8 through 17, where: the signal path includes a clock path; the input signal includes an input clock signal; and the respective output signals include respective output clock signals.

An apparatus is described. The following provides an overview of aspects of the apparatus as described herein:

Aspect 19: An apparatus, including: an array of memory cells configured to store data; an input component for a clock path associated with active periods and inactive periods, the input component coupled with the clock path and an input clock signal line; one or more output components for the clock path, the one or more output components each coupled with the clock path and a respective output clock signal line of one or more output clock signal lines, where each of the active periods corresponds to a respective operation being performed at the array of memory cells based at least in part on one or more output clock signals on the one or more output clock signal lines; and an inversion control component configured to generate a control signal, where, to operate the clock path according to a first polarity during a first subset of the active periods and operate the clock path according to a second polarity during a second subset of the active periods: the input component is configured to selectively invert, based at least in part on the control signal, the signaling on the clock path relative to an input clock signal on the input clock signal line during the first subset of the active periods; and each of the one or more output components is configured to selectively invert, based at least in part on the control signal, a respective output clock signal on the respective output clock signal line relative to the signaling on the clock path during the first subset of the active periods.

Aspect 20: The apparatus of aspect 19, where, to operate the clock path according to the first polarity during the first subset of the active periods and operate the clock path according to the second polarity during the second subset of the active periods: the inversion control component is configured to cause the control signal to be in a first state during the first subset of the active periods and to be in a second state during the second subset of the active periods; the input component is configured to invert the signaling on the clock path relative to the input clock signal when the control signal is in the first state and relay the input clock signal to the clock path when the control signal is in the second state; and each of the one or more output components is configured to invert the respective output clock signal relative to the signaling on the clock path when the control signal is in the first state and relay the signaling on the clock path to the respective output clock signal line when the control signal is in the second state.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, the signal may represent a bus of signals, where the bus may have a variety of bit widths.

The terms "electronic communication," "conductive contact," "connected," and "coupled" may refer to a relationship between components that supports the flow of signals between the components. Components are considered in electronic communication with (or in conductive contact with or connected with or coupled with) one another if there is any conductive path between the components that can, at any time, support the flow of signals between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some examples, the flow of signals between the connected components may be interrupted for a time, for example, using one or more intermediate components such as switches or transistors.

The term "coupling" refers to condition of moving from an open-circuit relationship between components in which signals are not presently capable of being communicated between the components over a conductive path to a closed-circuit relationship between components in which signals are capable of being communicated between components over the conductive path. When a component, such as a controller, couples other components together, the component initiates a change that allows signals to flow between the other components over a conductive path that previously did not permit signals to flow.

The term "isolated" refers to a relationship between components in which signals are not presently capable of flowing between the components. Components are isolated from each other if there is an open circuit between them. For example, two components separated by a switch that is positioned between the components are isolated from each other when the switch is open. When a controller isolates two components, the controller affects a change that prevents signals from flowing between the components using a conductive path that previously permitted signals to flow.

The devices discussed herein, including a memory array, may be formed on a semiconductor substrate, such as silicon, germanium, silicon-germanium alloy, gallium arsenide, gallium nitride, etc. In some examples, the substrate is a semiconductor wafer. In other examples, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and comprise a three terminal device including a source, drain, and gate. The terminals may be connected to other electronic elements through conductive materials, e.g., metals. The source and drain may be conductive and may comprise a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details to providing an understanding of the described techniques. These techniques, however, may be practiced without these specific details. In some instances, well-known structures and devices are shown in block diagram form to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

For example, the various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media can comprise RAM, ROM, electrically erasable programmable read-only memory (EEPROM), compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, digital subscriber line (DSL), or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

The description herein is provided to enable a person skilled in the art to make or use the disclosure. Various modifications to the disclosure will be apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. An apparatus, comprising:
    an input component for a signal path associated with active periods and inactive periods, the input component coupled with the signal path and an input signal line;
    one or more output components for the signal path, the one or more output components each coupled with the signal path and a respective output signal line of one or more output signal lines, wherein each of the active periods corresponds to a respective operation being performed by the apparatus based at least in part on one or more output signals on the one or more output signal lines; and
    an inversion control component configured to operate the signal path according to a first polarity during a first subset of the active periods and operate the signal path according to a second polarity during a second subset of the active periods, wherein the first polarity corresponds to signaling on the signal path being inverted relative to an input signal on the input signal line and the one or more output signals on the one or more output signal lines, and wherein the second polarity corresponds to signaling on the signal path being uninverted relative to the input signal on the input signal line and the one or more output signals on the one or more output signal lines.

2. The apparatus of claim 1, wherein:
    the input component is coupled with the inversion control component and configured to selectively invert, based at least in part on a control signal output by the inversion control component, the signaling on the signal path relative to the input signal; and
    each of the one or more output components is coupled with the inversion control component and configured to selectively invert, based at least in part on the control signal, a respective output signal on the respective output signal line relative to the signaling on the signal path.

3. The apparatus of claim 1, wherein active periods within the first subset of the active periods alternate with active periods within the second subset.

4. The apparatus of claim 1, wherein the inversion control component is further configured to:
    operate the signal path according to the first polarity during a first subset of the inactive periods; and
    operate the signal path according to the second polarity during a second subset of the inactive periods.

5. The apparatus of claim 1, wherein the inversion control component is configured to toggle a polarity of the signal path between the first polarity and the second polarity at a beginning of each of the active periods or at a beginning of each of the inactive periods.

6. The apparatus of claim 1, wherein the one or more output signals on the one or more output signal lines are uninverted relative to the input signal on the input signal line regardless of whether the signal path is operated according to the first polarity or the second polarity.

7. The apparatus of claim 1, wherein the inversion control component is further configured to:
    switch from operating the signal path according to the first polarity to operating the signal path according to the second polarity based at least in part on second signaling being received by the apparatus.

8. The apparatus of claim 7, wherein the respective operation corresponding to each of the active periods is performed by the apparatus based at least in part on the second signaling being received by the apparatus.

9. The apparatus of claim 7, wherein:
    the apparatus comprises a memory device; and
    the second signaling comprises a command to access a memory array within the memory device.

10. The apparatus of claim 1, wherein the inversion control component comprises a flip-flop circuit configured to change state based at least in part on a beginning of an active period for the signal path.

11. The apparatus of claim 1, wherein:
    the signal path comprises a clock path;
    the input signal comprises an input clock signal; and
    the respective output signals comprise respective output clock signals.

12. A method, comprising:
    operating a signal path associated with active periods and inactive periods according to a first polarity during a first subset of the active periods, wherein the signal path is coupled with an input signal line and one or more output signal lines, and wherein the first polarity corresponds to signaling on the signal path being inverted relative to an input signal on the input signal line and one or more output signals on the one or more output signal lines;

operating the signal path according to a second polarity during a second subset of the active periods, wherein the second polarity corresponds to signaling on the signal path being uninverted relative to the input signal on the input signal line and the one or more output signals on the one or more output signal lines; and performing, during each of the active periods, a respective operation based at least in part on the one or more output signals on the one or more output signal lines.

13. The method of claim 12, further comprising:
generating a control signal for an input component coupled with the input signal line and for one or more output components each coupled with a respective output signal line of the one or more output signal lines, wherein operating the signal path according to the first polarity comprises:
inverting, using the input component and based at least in part on the control signal, the signaling on the signal path relative to the input signal on the input signal line; and
inverting, using each of one or more output components and based at least in part on the control signal, a respective output signal on the respective output signal line relative to the signaling on the signal path.

14. The method of claim 12, further comprising:
operating the signal path according to the first polarity during a first subset of the inactive periods; and
operating the signal path according to the second polarity during a second subset of the inactive periods.

15. The method of claim 12, wherein a polarity of the signal path is toggled between the first polarity and the second polarity at a beginning of each of the active periods or at a beginning of each of the inactive periods.

16. The method of claim 12, wherein the one or more output signals on the one or more output signal lines are uninverted relative to the input signal on the input signal line regardless of whether the signal path is operated according to the first polarity or the second polarity.

17. The method of claim 12, wherein a first device includes the signal path, the method further comprising:
receiving second signaling at the first device from a second device; and
switching from operating the signal path according to the first polarity to operating the signal path according to the second polarity based at least in part on receiving the second signaling.

18. The method of claim 12, wherein:
the signal path comprises a clock path;
the input signal comprises an input clock signal; and
the respective output signals comprise respective output clock signals.

19. An apparatus, comprising:
an array of memory cells configured to store data;
an input component for a clock path associated with active periods and inactive periods, the input component coupled with the clock path and an input clock signal line;
one or more output components for the clock path, the one or more output components each coupled with the clock path and a respective output clock signal line of one or more output clock signal lines, wherein each of the active periods corresponds to a respective operation being performed at the array of memory cells based at least in part on one or more output clock signals on the one or more output clock signal lines; and
an inversion control component configured to generate a control signal, wherein, to operate the clock path according to a first polarity during a first subset of the active periods and operate the clock path according to a second polarity during a second subset of the active periods:
the input component is configured to selectively invert, based at least in part on the control signal, the signaling on the clock path relative to an input clock signal on the input clock signal line during the first subset of the active periods; and
each of the one or more output components is configured to selectively invert, based at least in part on the control signal, a respective output clock signal on the respective output clock signal line relative to the signaling on the clock path during the first subset of the active periods.

20. The apparatus of claim 19, wherein, to operate the clock path according to the first polarity during the first subset of the active periods and operate the clock path according to the second polarity during the second subset of the active periods:
the inversion control component is configured to cause the control signal to be in a first state during the first subset of the active periods and to be in a second state during the second subset of the active periods;
the input component is configured to invert the signaling on the clock path relative to the input clock signal when the control signal is in the first state and relay the input clock signal to the clock path when the control signal is in the second state; and
each of the one or more output components is configured to invert the respective output clock signal relative to the signaling on the clock path when the control signal is in the first state and relay the signaling on the clock path to the respective output clock signal line when the control signal is in the second state.

* * * * *